(12) United States Patent
Cowans et al.

(10) Patent No.: US 7,661,460 B1
(45) Date of Patent: Feb. 16, 2010

(54) HEAT EXCHANGERS FOR FLUID MEDIA

(75) Inventors: Kenneth W. Cowans, Fullerton, CA (US); William W. Cowans, Fullerton, CA (US)

(73) Assignee: Advanced Thermal Sciences Corp., Anaheim, CA (US)

( * ) Notice: Subject to any disclaimer, the term of this patent is extended or adjusted under 35 U.S.C. 154(b) by 661 days.

(21) Appl. No.: 11/005,630

(22) Filed: Dec. 7, 2004

Related U.S. Application Data

(60) Provisional application No. 60/530,747, filed on Dec. 18, 2003.

(51) Int. Cl.
*F25B 29/00* (2006.01)
*F28D 7/02* (2006.01)
*F28D 7/10* (2006.01)

(52) U.S. Cl. .................. 165/64; 165/140; 165/163

(58) Field of Classification Search ............. 165/163, 165/181, 201, 64, 110, 140
See application file for complete search history.

(56) References Cited

U.S. PATENT DOCUMENTS

| 2,471,317 | A | * | 5/1949 | Fausek et. al. | ............. 165/141 |
| 4,313,491 | A | * | 2/1982 | Molitor | ............. 165/83 |
| 4,603,730 | A | * | 8/1986 | Davis et al. | ............. 165/263 |
| 6,031,751 | A | * | 2/2000 | Janko | ............. 363/144 |

* cited by examiner

*Primary Examiner*—Ljiljana (Lil) V Ciric
(74) *Attorney, Agent, or Firm*—Jones, Tullar & Cooper, P.C.

(57) ABSTRACT

A compact heat exchanger for interchanging thermal energy between at least two fluids, one of which fluids may be a refrigerant in hot or cold form or in a liquid/vapor phase, and another of which fluids is a thermal transfer fluid. The heat exchanger may incorporate an internal heating element. The thermal transfer fluid is transported between two concentric metal tubes, while the refrigerant moves along a tubing helically wrapped about or between the tubes and is in thermal contact therewith.

5 Claims, 7 Drawing Sheets

HEAT EXCHANGERS FOR FLUID MEDIA

REFERENCE TO PRIOR APPLICATIONS

This application relies for priority on previously filed provisional application Ser. No. 60/530,747 filed Dec. 18, 2003 and entitled "Versatile and Efficient Three-Way Heat Exchangers for Fluid Media and Systems Employing Such Exchangers".

FIELD OF THE INVENTION

This invention relates to systems and devices for thermal energy exchange between different fluid media and more particularly to heat exchangers adaptable to a number of applications and to systems which advantageously use such heat exchangers.

BACKGROUND OF THE INVENTION

Many heat exchanger systems are known which function with liquid and gaseous media and more such systems are constantly being developed for new industrial applications. As novel precision manufacturing and control components are being devised, they create needs for new systems that use heat exchangers to establish and/or maintain operating temperature levels within particular limits in those components while meeting different criteria as to resolution, heat flux and the like. There are also concurrent demands for thermal efficiency and low cost operation in such systems that must be met.

In some modern industrial applications, for example, the products being processed must be brought to particular temperature levels to accomplish specific functions. After this the temperature level may have to be changed so that a different function can be carried out. In these modern systems, efficiency, temperature control and freedom from pollution are necessary prerequisites. As is usually the case, low purchase and continued ownership costs, are virtually necessary for these systems. Heating and cooling systems must often respond quickly when operating temperatures are changed in order to minimize expensive wait times in the production process. They must also operate faultlessly over long time spans with little down time. Nevertheless, for cost reasons the new designs should also be adaptable with little modification to different heating, cooling, temperature range and heat load situations.

Semiconductor fabricating facilities, for example, provide good illustrations of the demands often found in modern heat exchange applications. Semiconductor elements are generally initially processed as multiple small closely distributed local areas of semiconductor wafers which are subsequently subdivided into the individual components. As wafer sizes have increased with time, e.g. to 300 mm in diameter as is presently the case, demands for efficient and reliable operation of their support components has become ever mole important. This is because the cost of each wafer has increased in proportion to its area. A 300 mm wafer is 2.25 times the area of its predecessor, the 200 mm diameter wafer. During manufacture the wafers are positioned at or transported between different "cluster" tools at which they are heated or cooled to different levels, for chemical, radio-frequency radiation and other steps. Each of these subprocesses is carried out for a limited time, usually in a controlled temperature range. The temperature control systems employed use different heat and refrigeration sources, and the heating and cooling loads and the temperatures involved are widely different in some respects, but quite similar in others.

For these reasons, it is often possible to utilize a single given source of thermal control to provide controlled temperature environments for carrying out different functions at cluster tools. Also, it is common in these and other applications to try to utilize environmentally safe refrigerant systems and efficient and stable heat exchange systems together with electronic controls to establish and maintain precise temperatures for given times. An efficient and versatile heat exchanger is vital to temperature control for these and other systems. If the heat exchanger can accommodate or be adaptable to the use of different fluid media at different temperature levels, and use different energy sources, new and cost advantageous temperature control units (TCU), as these units are termed, can possibly be provided. Such units can potentially meet the ever more stringent demands for cost performance and efficiency.

The typical TCU uses a heat transfer fluid, typically either a mixture of water and ethylene glycol or a perfluorinated fluid (e.g. Galden), that is pumped in a closed circuit between the TCU and the load to be controlled at a desired temperature. This fluid is heated or cooled as dictated by thermal conditions at the load. The pump driving the flow of heat transfer fluid used is part of the TCU, as is any reservoir of heat transfer fluid, and any control subsystem needed.

Heat exchangers are needed to effect the heating and cooling within the TCU. Cooling is most typically supported by a vapor-cycle refrigerator in evaporating a condensed fluid to vapor in conventional vapor-cycle manner. The heat exchanger effects the transfer of heat from the heat transfer fluid to the refrigerant while maintaining physical isolation between the fluids. When the heat transfer fluid needs to be heated sometimes the same passage that is used to boil refrigerant during the cooling process is fed a supply of hot compressed gaseous refrigerant from the output of the vapor-cycle compressor. Alternatively, heat required can be supplied by an electrical heater in another heat exchanger to either supplant the hot gas heat or said electrical heater and its heat exchanger is sometimes used as the entire heat source.

Heretofore, the heat exchangers described above have been designed and built in two different assembly configurations in various TCUs.

1. When a fairly leisurely rate of temperature change can be accepted, the TCU is designed with a large reservoir of heat transfer fluid in which reservoir are immersed any electrical heaters as well as a long tube within which is passed the evaporating fluid or hot gas to cool or heat as discussed above.

2. The other common configuration uses separate discrete heat exchangers to perform the two functions involving the refrigerant in one case and the electrical heater in the other.

The first configuration has the advantage of low cost and a reasonably small volume. Since a large fluid reservoir is often needed it requires little cost to design immersed tubes and electric heaters within said reservoir. This configuration has the disadvantage of slow response along with a reduced level of efficiency when compared with the configuration using discrete heat exchangers. This is because the velocity within the large reservoirs is, of necessity, low and the characteristic distances within the heat transfer passages large. Thus the heat transfer coefficient between the fluid and the wall of the heat exchanger(s) is low. This results in large temperature differences being needed to transfer the required amount of heat. The heating/cooling TCU thus must operate at higher maximum temperatures when heating and lower minimum temperatures when cooling. This results in a much lower thermal system efficiency for the TCU than is possible with more optimally designed heat exchangers. Also, as noted, the system is sluggish in response to changing temperature needs. This slow response is also a result of the inefficient heat exchange used.

The disadvantage of the second configuration is twofold. The volume required to direct a nest of piping to and from each of the discrete heat exchangers involving flow of refrigerants, heat-transfer fluid and electrical power is generally large, and the cost of such piping, together with the required fittings, is often an excessive part of the overall cost. Also, conventional heat exchangers that are at once efficient and capable of withstanding high internal refrigerant pressure over a wide range of temperature are costly in themselves.

SUMMARY OF THE INVENTION

In accordance with one aspect of the invention a versatile heat exchanger employs an encircling flow of one fluid medium to cool or heat a general fluid thermal transfer medium that flows generally longitudinally. This can be termed a "three-way heat exchanger" because it can also include an internal electrical heater for the thermal transfer fluid. In one example, the exchanger incorporates a length of metallic tubing for a first fluid medium, the tubing being wrapped helically between a inner mandrel element or solid mandrel and an outer tubular enclosure. The second fluid medium flows in a generally parallel or counterflow path helically between the turns of the helically wrapped tubing, being contained between the previously mentioned mandrel and hollow enclosure. Thermal energy transfer takes place directly through the walls of the tubing. The interior space within the mandrel, if said mandrel is a hollow tube, can accommodate an optional electronic heater for independent or cumulative heating of fluid media. The advantages of this mounting include the facility for changing heaters, either for repair or replacement without incurring the need for breaking into the flow circuits of either the refrigerant or heat transfer fluid. Such construction also allows for the use of an electrical heater without the necessity for having extra plumbing to accommodate said heater. The construction also places the heater in very close intimate thermal contact with the heat transfer fluid without the need for constructing any further heat exchangers. The heat-transfer fluid flows at a relatively high velocity confined within its helical path and thus exhibits a high heat transfer coefficient. In this regard the construction of the three-way heat exchangers provides an extremely economical and compact system for exchanging heat amongst heat transfer fluid, vapor-cycle refrigeration circuit and electrical heater. In addition to these virtues, the refrigerant, being contained within a metallic tube of circular cross-section can exist at high temperature and pressure without incurring any danger of rupturing the containing vessel.

The first fluid flowing within the helical tubing can be a refrigerant at a given temperature, and the second fluid can then be a thermal transfer fluid. If the turns of the helical tubing are brazed, soldered or welded to the boundary walls, and said tubes are fabricated of thermally conductive material heat transfer is very efficient. Furthermore, the unit is very rugged and can withstand wide temperature differentials and high pressures of both the fluids contained within the exchanger.

The helically wrapped tubing and mandrel combination may also advantageously include a helically disposed, thermally conductive strip between adjacent turns of the helical tubing. In both examples, the center tube has an open interior which can receive a cylindrical electric heater for increasing the temperature of the thermal transfer fluid.

The first thermal media may be a pressurized liquid, gaseous or mixed phase refrigerant flowing within the helically wrapped tubing while thermal transfer fluid flows helically about the exterior of the mandrel, confined by the turns of the helical tubing. Such flows may be either in counterflow or parallel to each other, depending on the characteristics of the two flows and of the system that employs the exchanger. The size and spacing of the helical tubing determines the volumetric ratio of the two flows, and with a typical refrigeration cycle the unit can be small but highly efficient.

This construction, using concentric elements, also facilitates incorporation of input and output ports and headers. The enclosure tubing about the helical wrapping need only lead to radial expansions to allow input and output of the second fluid, while the helical tubing can be longitudinally coupled at its ends for input and output of the first fluid media. This arrangement is particularly thermally efficient because of the complete intermixing of the thermal transfer fluid and the short heat transfer paths through the intervening tubing walls.

In another example, the first fluid medium flows in the gap between two concentric tubes, the outer one of which is contacted by a helically wrapped tubing for the second fluid medium. Provisions of one or the other of the concentric tubes maintain a close and precise spacing, as heat transfer takes place between the longitudinal end helical flows.

A TCU that makes advantageous use of this compact, versatile heat exchanger includes a single system operating on a liquid/vapor refrigeration cycle and providing a pressurized ambient temperature refrigerant. Two or more channels, each including a separate process tool, may be separately controlled by this one energy source. Refrigerant is selectively expanded in each channel under commands from the controller to provide any cooing needed to each channel. The expanded refrigerant in each channel is directed to one pathway in the respective heat exchanger. A second pathway through the heat exchanger is in a loop for thermal transfer fluid pumped from a reservoir and ultimately through the process tool for temperature control, and then back to the reservoir. Heaters internally disposed within the heat exchangers can be used to increase the temperature capabilities for the process tool. System costs may be reduced, if higher heat capacity is desired, by using two or more compact heat exchangers in parallel. Furthermore, a single controller may be used to control the temperature of separate process tools, each having its own control loop for thermal transfer fluid. This permits a single refrigeration cycle system to be used with a single control to operate two or more process tools with different thermal demands at different target temperatures.

Because of its physical strength and stability, the exchanger can alternatively receive a high temperature pressurized refrigerant and a thermal transfer media to be heated thereby to a substantial temperature. Output from a relatively inexpensive compressor system can in one branch be used without condensation to provide hot pressurized gaseous refrigerant for use directly with a process medium and a process tool. In another branch the compressor output can be cooled to a liquid state at high pressure, then controllably expanded for chilling the media and process tool.

Another low cost but efficient temperature control unit in accordance with the invention uses this heat exchanger between a thermal transfer loop and an active refrigeration loop to alternatively heat or chill a process tool. In a conventional flow path, pressurized refrigerant after condensation is fed as a mixed phase gas through an expansion valve to establish a selected chilled level at the tool. Both of the alternate heating and cooling paths are isolated from each other by unidirectional check valves in the lines feeding to the heat exchanger. The return path to the compressor extends via a desuperheater valve and a compressor accumulator, to the compressor input. For greater efficiency, a subcooler may also be used. This enables the system to operate in different modes, to heat or cool a process tool, or to use a combination heating mode with a time modulated control mode using both hot and cold sources. It also can be used for rapid heating changes and rapid cooling transitions, as desired, when changes are needed.

BRIEF DESCRIPTION OF THE DRAWINGS

A better understanding of the invention may be had by reference to the following description taken in conjunction with the accompanying drawings, in which.

DETAILED DESCRIPTION OF THE INVENTION

Figure 1:
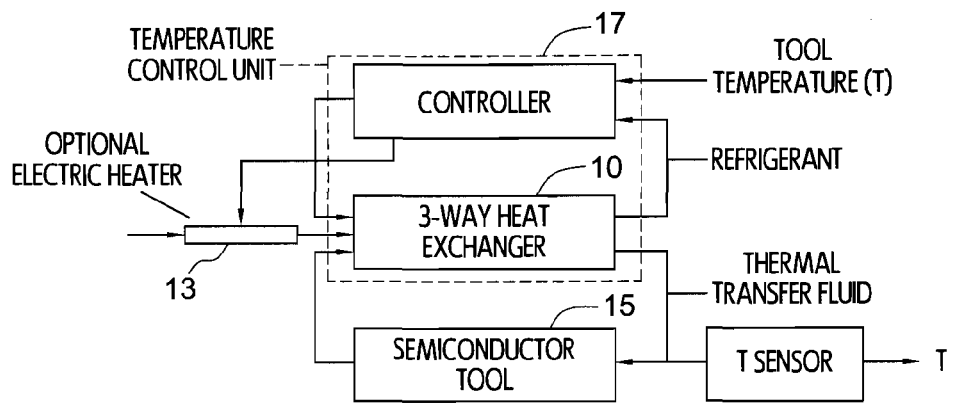
FIG. 1 is a block diagram of a generic temperature control system using a versatile three-way heat exchanger for fluid media in accordance with the invention.
Figure 2:
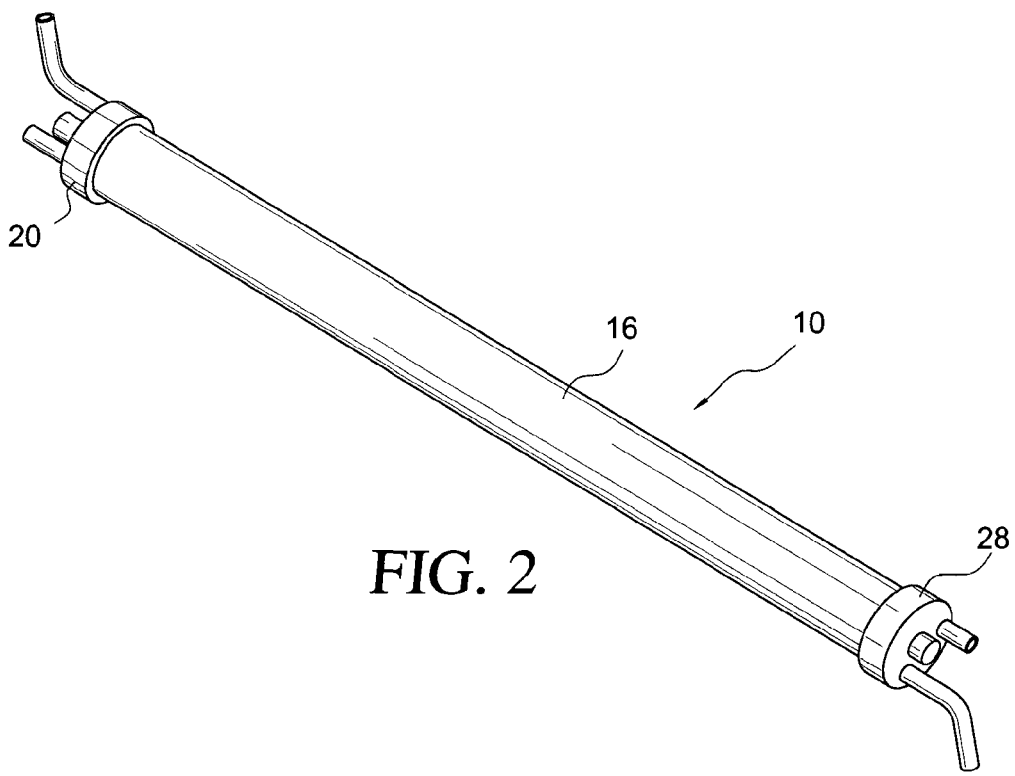
FIG. 2 is a perspective view of a three-way heat exchanger that may be employed in the system of FIG. 1.

A versatile three-way heat exchanger 10 as is used with a TCU 17 for controlling the temperature of a process tool 15 in accordance with the target temperatures set by a controller in the TCU is depicted in FIG. 1. The heat exchanger 10 itself, shown in the views of FIGS. 2-4, comprises a compact structure in which a thermal transfer fluid and a refrigerant flow helically but generally axially along the central axis of an interior mandrel 12. The mandrel 12 is a hollow tube of a metallic material, such as copper, aluminum or stainless steel, here approximately 0.500" in inside diameter by way of example. The versatility of the heat exchanger 10 is partially based on the fact that the concept can be realized with different size structures for different heat loads. They may employ fluid flows that are generally parallel or counterflow, and the media that is transported can be liquid, gaseous or of mixed phase. Also, whatever the fluid state, these flows are thermally interactive even though physically separated, because of short thermal flow paths through generally metallic structures.

In the present example the second media is a thermal transfer fluid passing through a semiconductor tool system 15 (FIG. 1) and the first media is a refrigerant that is either pressurized gas or mixed phase fluid from a refrigeration generating system that is a part of the TCU 17. An electric heater element 13 (FIGS. 1, 3 and 4) can, if desired, be disposed in the hollow mandrel 12, inserted via an open end. Refrigerant flow is within a metallic tubing 14 of approximately ⅜" outer diameter (in this example) that is spirally or helically wrapped about the mandrel tube 12 with a pitch of approximately 0.75"/turn. The pitch of the helical tubing 14 leaves a space between successive turns that is about 0.375". This provides a cross-sectional area that is only slightly greater than the cross-sectional area between the turns of the tubing 14.

The fluid path for thermal transfer fluid along the outside of the mandrel tube 12 feeds in from an inlet end (FIGS. 3 and 4) within a concentrically positioned enclosure tube 16 which is in line contact with an outside surface of the turns of refrigerant tubing 14. The inner and outer arcs respectively of the turns of the tubing 14 are mechanically and thermally joined to the mandrel 12 and enclosure tube 16 separately by brazing in this example, although welding or soldering may also be used. The thermal transfer fluid flow is thus helical about the outside of the mandrel tube 12, within the annulus formed by the enclosure tube 16 and between the refrigerant tubing 14 turns. The refrigerant tubing 14 is of heat conductive material, with a wall thickness suitable for withstanding the range of refrigerant pressures to be encountered. Similarly the mandrel 12 and enclosure tubing 16 are of inflexible heat conductive material, typically copper. Since the thermal transfer fluid local flow is helical, there is complete intermixing and intimate thermal contact along short heat flow paths through the tubing 14 walls.

The heat transfer efficiency of this exchanger is notable. For example, with an exchanger 10 having tubing sizes as noted, the energy load of a 5 kw compressor can be accommodated by an exchanger having an overall length o 25.010" and an interior heat exchange length of 23.63".

Figure 5:
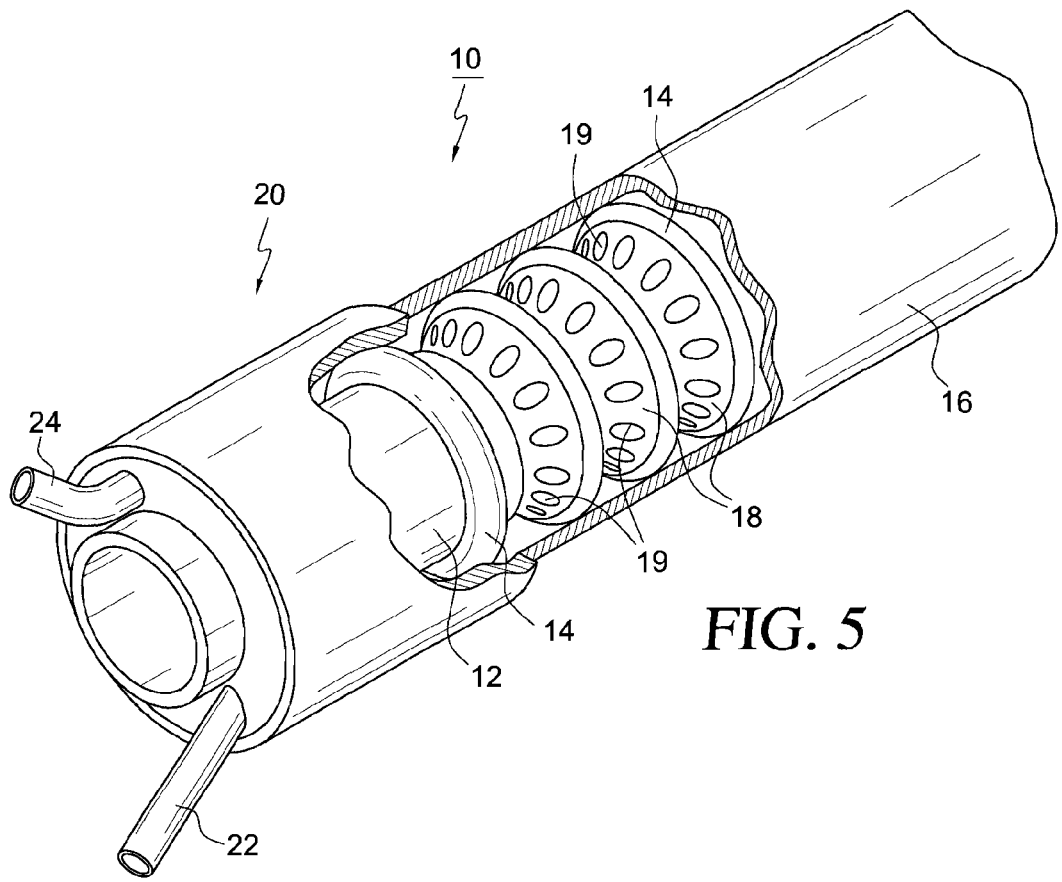
FIG. 5 is a perspective view, partially broken away, of a segment of a heat exchanger in accordance with the invention using a perforated thermally conductive strip between helical tubing turns.
Figure 6:
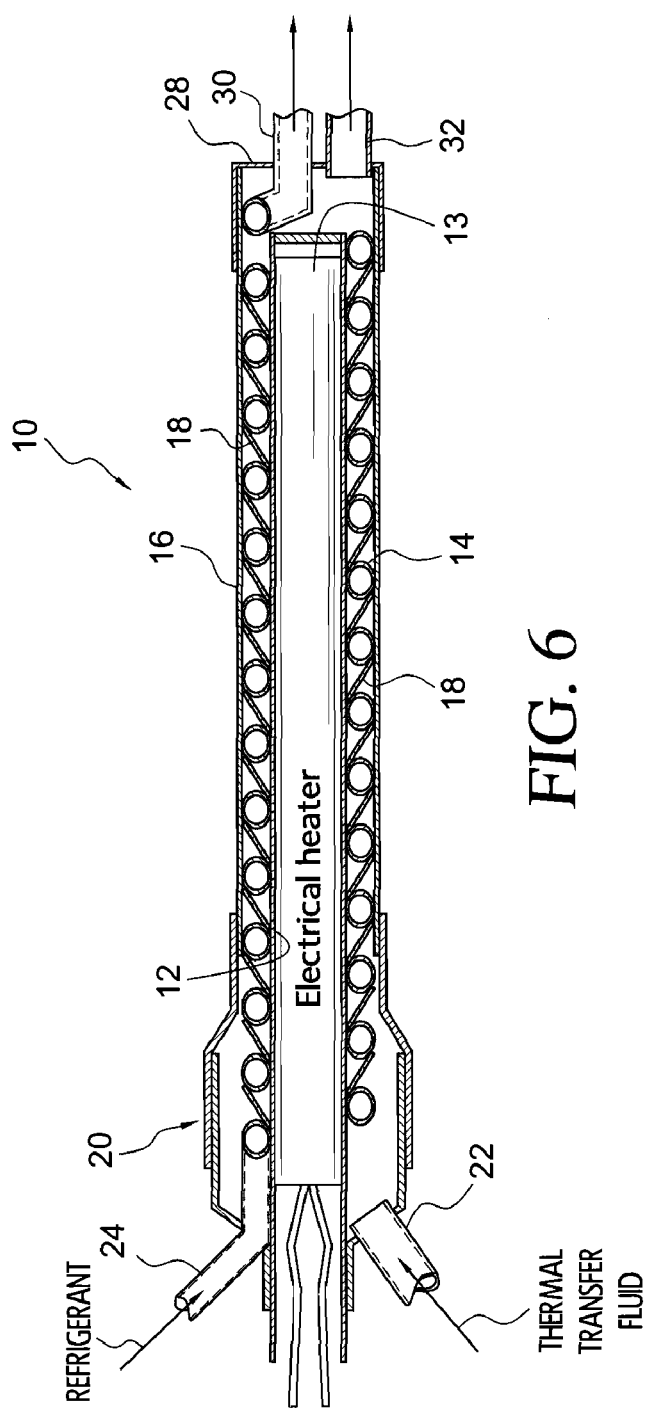
FIG. 6 is a side sectional view of the heat exchanger of FIG. 5.
Figure 7:
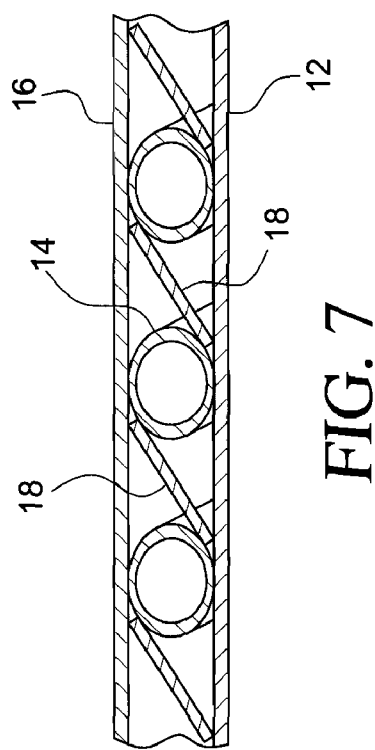
FIG. 7 is an enlarged sectional side view of the exchanger of FIGS. 4 and 5, showing further details thereof.

Heat transfer between the outside of the refrigerant tube 14 and the mass of flowing thermal transfer fluid may also be facilitated if desired by an interposed helically wrapped perforated fin 18 of thermally conductive metal such as copper, as shown in FIGS. 5-7. The fin 18 is wrapped about the mandrel tube 12 at an angle to the central axis so as to advance along the mandrel between successive turns of the refrigerant tubing 14. The perforated fin 18 in this example is a strip of approximately ½" width and has periodic patterns of spaced apart apertures 19 for allowing free fluid flow. Each turn is angled from between the inner side of one turn of the refrigerant tubing 14, adjacent the mandrel 12 surface, to the outer side of the next adjacent tubing turn. Thus the perforated fin 18 provides heat flow paths not only within the thermal transfer fluid but also between the mandrel tube 12, the enclosure tube 16, and the helical tubing 14. Use of the fin 18 is contingent on heat load requirements, since for most applications there is adequate heat transfer capacity by selecting the size and geometry of the tubings.

Figure 3:
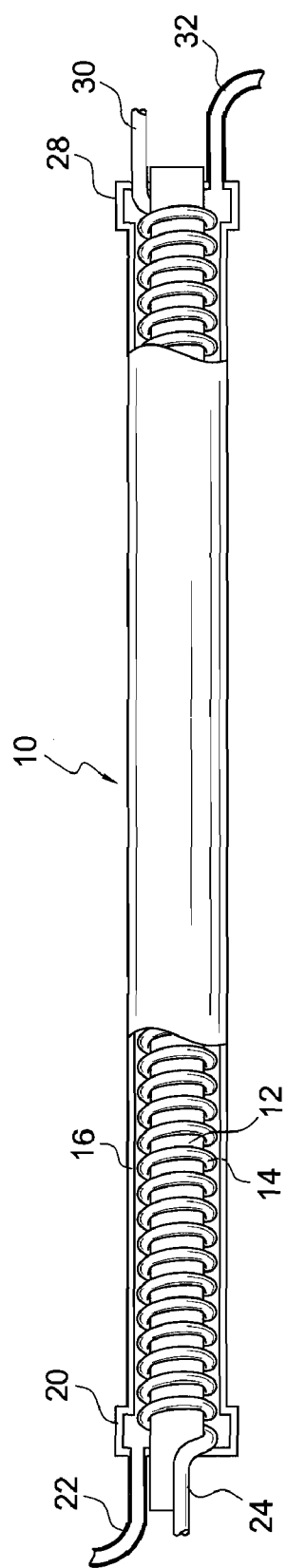
FIG. 3 is a side view, partially broken away, of FIG. 2
Figure 4:
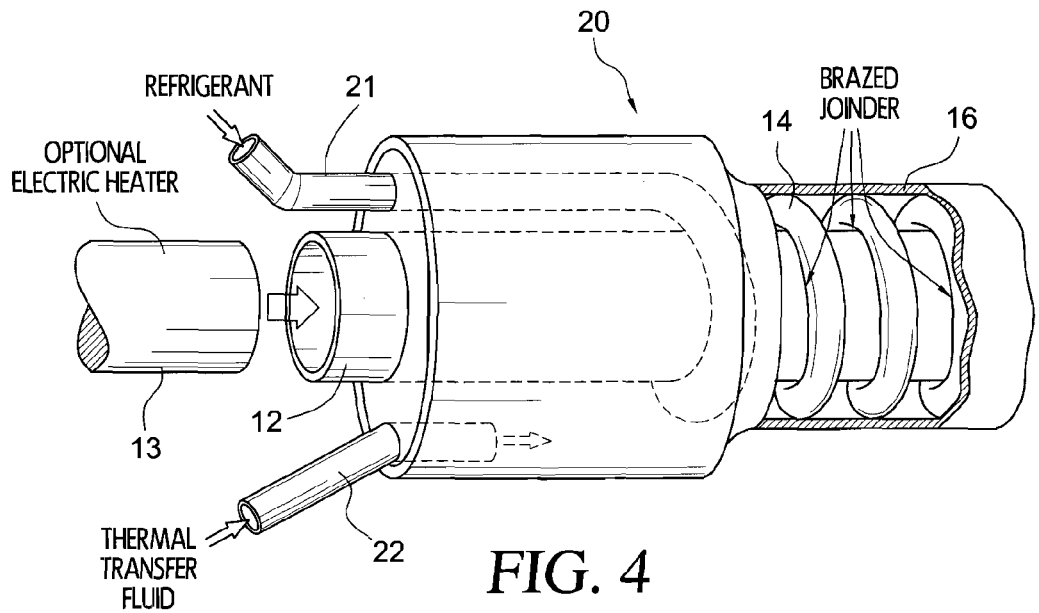
FIG. 4 is a fragmentary perspective view, partially broken away, of the heat exchanger of FIGS. 2-3, showing further details thereof.

The inlet side of the heat exchanger 10 is arbitrary, since flows can be in either direction, but in this example is chosen as the side to the left of FIGS. 3 and 4. The enclosure tube 16 has an enlarged inlet section 20 to which thermal transfer fluid is supplied by an inlet port 22. At the same end but in a spaced apart adjacent location, the refrigerant tubing 14 includes an inlet segment 24 which extends axially along the mandrel tube 12 for only a short distance before merging into the helical wrap path about the mandrel tube 12. The refrigerant and thermal transfer fluid thus flow in the same axial direction from the inlet side of the mandrel tube 12 to an outlet section 28 (FIGS. 3 and 3), where a terminal segment 30 of the refrigerant tubing 14 includes an outlet port for refrigerant flow. An adjacent outlet port 34 for thermal transfer fluid communicates with the annular space between the mandrel type 12 and any associated unit.

The mandrel tube 12, refrigerant tubing 14 and the perforated fin 18, if employed, are thermally united by being brazed or silver soldered together to assure mechanical strength and efficient thermal energy transfer between the flowing liquids along the entire length of the unit. The helical turns introduced in the thermal transfer fluid as it is transported axially along the heat exchanger 10 assure full and repeated fluid intermixing, adding, minimization of the thermal differential relative to the fluid in the refrigerant tubing 24. Since the outside wall of the refrigerant tubing 14 can be relatively thin, dependent on pressures to be resisted, and since it is contacted on all sides by the encompassing thermal transfer fluid, heat energy is efficiently transferred between the two fluids.

This geometry assures short thermal flow paths between the refrigerant and thermal transfer fluid along the entire length of the heat exchanger 10. If it is desired to have further heat energy input for raising the temperature of the thermal transfer fluid, the optional electronic heater element 13 inserted into the open central interior of the mandrel tube 12 may be energized. This optional heater element 13 can be a cylindrical device having a suitable power rating (e.g. 500 watts, 1500 watts, 2500 watts) such as supplied by Watlow Electric Mfg. Co. of St. Louis, Mo.

In this example, therefore, liquid flows from the input section 20 to the output section 30 of the heat exchanger 12 in a helical path but does not encounter a high impedance structure that would substantially restrict or limit the flow. At the same time, the flow of refrigerant is virtually unimpeded within the tubing 14, even though it also follows a helical path. In the event that the refrigerant is operating in a hot gas phase, or adding thermal energy to the thermal transfer fluid so that liquid does not collect in the refrigerant tubing, liquid is forced through under pressure and ejected as output in largely gaseous form.

Figure 8:
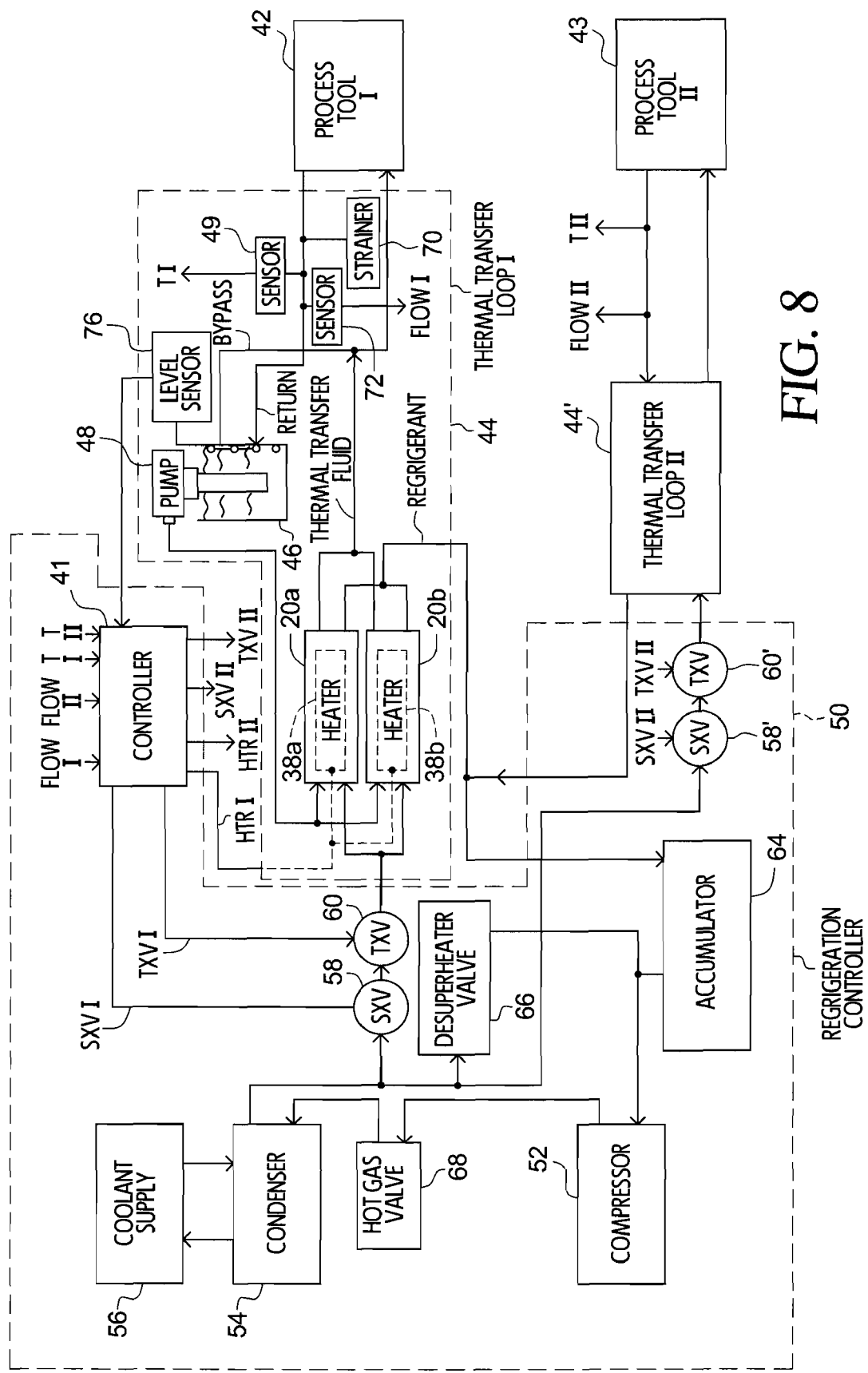
FIG. 8 is a block diagram of a temperature control unit utilizing versatile heat ex changers in accordance with the invention.

An example of the use of this versatile three-way heat exchanger with a temperature or thermal control unit (TCU) 40 is depicted in FIG. 8, where the system is for cooling or heating cluster tools 42, 43 in dual channels in a semiconductor processing facility. The common TCU 40 and a single controller 41 feed a cycling refrigerant separately to each of the channels, which are designated as thermal transfer fluid loops (TTF loops) I and II, specifically numbers 44 and 44'. In each of the TTF loops 44, 44', a reservoir 46 supplies the stable heat transfer fluid, which has a wide differential between liquefying and boiling points, and which may comprise a proprietary fluid such as "Galden" or a mixture of antifreeze (e.g. ethylene glycol) and water. The liquid in the reservoir 46 is pumped, in each channel, by a drive pump 48, such as a submersible centrifugal pump of the type made by Grundfos Management A/W of Bjerringbro, Denmark. The TTF loops 44, 44' for chilling or heating the cluster tools 42, 43 recycle the thermal transfer fluid in a constant flow through the associated three-way heat exchangers 20, as described above in conjunction with FIGS. 1-4. The heat exchangers 20 comprise, in channel I, parallel heat exchanger elements 20a and 20b, each including an internal heater 13a, 13b respectively, each heater controlled by the controller system 41. The two compact heat exchangers double the heat load capacity of the system.

In addition to the heater elements in the three-way heat exchangers 20, the controller 41 receives various inputs and provides other outputs to operative elements in the two control channels. Thus, a temperature sensor 49 or 49' in circuit with the output thermal transfer fluid from a cluster tool 42 or 43 respectively, provides an input that is utilized in maintaining the target temperature at the tool. The controller 41 may comprise an advanced proportional, integral, derivative (PID) system of the type described in U.S. Pat. No. 6,783,080 by Antoniou and Christofferson and entitled "Systems and Methods for Controlling Temperatures of Process Tools".

Only one of the refrigeration and heating loops, such as loop I, designated 50, will be described in detail, since it is to be understood that the loop 50 shares principal elements in common for both channels, but that individual controls are separate, inasmuch as different target temperatures may be set for the two channels. In the loop 50, a compressor 52 receives return refrigerant at its suction input, and provides high temperature, high pressure output to a condenser 54, where a coolant from a source 56, such as utility water supply, lowers the refrigerant temperature such that the pressurized refrigerant is liquefied, to provide chilling potential upon subsequent expansion. This expansion is effected by a serial pair of expansion valves, namely a solenoid expansion valve (SXV) 58 and a thermal expansion valve (TXV) 60. Each of the expansion valves is controlled by signals from the controller 41. In loop II there are also separately controlled SXV and TXV valves 58', 60' respectively, are also separately controlled in similar fashion. The disposition of serial SXV and TXV valves to assure stable and reliable expansion across a range of temperatures is described in more detail in copending application Ser. No. 10/777,320 entitled, "Thermal Control Systems for Process Tools Requiring Operation Over Wide Temperature Ranges", inventor Kenneth W. Cowans.

The return flow from the heat exchangers 20a, 20b is directed toward the suction input of the compressor 52, through a suction accumulator 64. Since it is desired to achieve a high level of efficiency and reliability in operation of the compressor 52, desuperheater valve 66 is, in known fashion, responsive to the input pressure at the compressor and modifies the suction input flow as needed to maintain the flow above a minimum level. Also, as known, a hot gas valve 68 is used in the circuit, to place a limit on the flow.

The return flow of thermal transfer fluid from the cluster tools 42, 43 is passed through a strainer 70 to collect any particulate matter and maintain the flow consistent, and through a flow sensor 72 which feeds a flow rate signal back to the controller 41. Check valves 74 in the input line to the cluster tools 42, 43, prevent reverse flow. A level sensor 76 with individual detector elements at various levels in the reservoir also provides input to the controller 41 to indicate the volume of thermal transfer fluid contained in the reservoir 46, so that a safe condition can be maintained or the system shut down in the event of failure or leakage.

In the operation of the system of FIG. 8, the refrigeration/heating loop 50 provides a consistent flow of pressurized liquid refrigerant to the expansion valves 58, 60 and 58', 60', in each of channels I and II. The controller 41 sets the target temperature for heating or chilling, which in this example ranges from 120° C. to −40° C. The controller 41 then adjusts the extent of thermal expansion of liquid refrigerant supplied to each of the two heat exchangers 20a, 20b, or adjusts the energy supplied to the heaters 13a, 13b in parallel. This dual usage of exchangers in parallel can be extended to any number desired, dependent upon the heat and refrigeration loads placed on the system.

The common portions of the refrigeration/heating loop 50 provide pressurized liquid flow of refrigerant to be controllably expanded by SXV 58 and TXV 60 in channel I, if substantial chilling is desired. The liquid/vapor mix directed to the parallel heat exchangers 20a and 20b thus cools down the thermal transfer fluid interchanged in the heat exchanger with the refrigerant, and delivered from the heat exchanger output ports to the input to the process tool 42. At the same time the process tool 43 is separately controlled in a chilling or heating mode. In the pure heating mode, expansion of the refrigerant is minimal and the heaters 38a, 38b are turned off to bring the temperature of the thermal transfer fluid down to the level desired after heat exchange.

Although the temperatures in the parallel heat exchangers 20, 20b in channel I are substantially identical, in channel II the temperature level reached after interchange with the refrigerant can be substantially different. The circulation of thermal transfer fluid through the system of heat exchanger 20, process loop 42 and output back to the reservoir 46 is substantially continuous. The temperature signal from the sensor 49 as to the temperature level in the process tool 42 is used by the controller 41 to make any necessary adjustments in the temperature maintained in the heat exchanger 20. Fluid pumped from the reservoir 46 out the pump 48 and back to the heat exchanger 20 thus moves continuously.

The system makes good use of the compact size and efficiency of the three-way heat exchanger and its ability to respond efficiently to a range of temperature.

Figure 9:
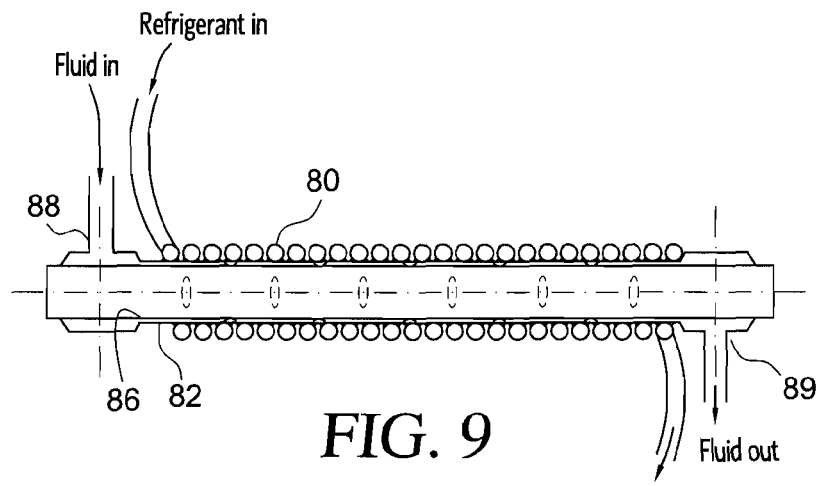
FIG. 9 is a cross-sectional view of a second version of a heat exchanger in accordance with the invention.
Figure 10:
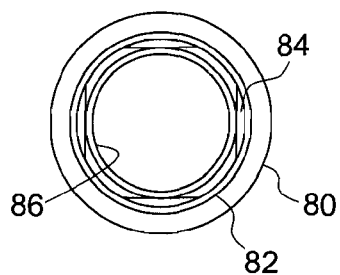
FIG. 10 is an end side sectional view of a central portion of the exchanger of FIG. 9.
Figure 11:
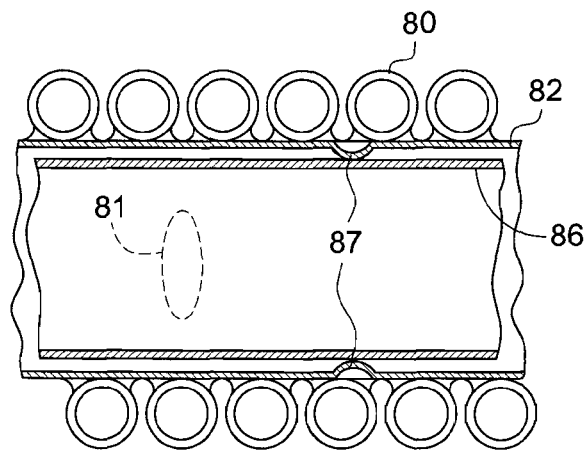
FIG. 11 is a sectional view of a fragment of the heat exchanger of FIGS. 9 and 10, showing further details thereof.

Another variant of the heat exchanger that affords comparable flexibility and versatility is shown in FIGS. 9, 10 and 11, to which reference is now made. In this construction, helical refrigerant tubing 80 is wrapped around an exterior mandrel 82 having internally directed dimples or projections 84. These are provided before the helical tubing 80 is wrapped about the outer surface, by placing it between symmetrical split die sections (not shown) and pressing in the pattern of dimples at different circumferential and axial locations. A solid metal bar of approximate diameter with concavities for receiving the dimples may be used to provide a close fit and backup surface. The dies are forced into the mandrel 82, which automatically centers itself between the dies and assures that the dimples are of equal depth on each opposing side of the tube.

The outer surface of the dimpled mandrel 82 can thereafter be wrapped with the spiraled tubing 80 for transporting refrigerant fluid. Thermal transfer fluid is flowed axially in a gap between the interior of the dimpled mandrel 82 and the exterior of a central tube 86 inserted into it and precisely matched to the inner diameter of the dimples. The central tube 86 again has a hollow interior within which an electrical heater tube (not shown), may optionally be inserted and energized as in the prior example.

Input flow of refrigerant is supplied at one end of the helically wrapped tubing 80, and an inlet header 88 is disposed about the central tube 86 at the same end, feeding thermal transfer fluid via a central annular gap concentric about the central axis between the mandrel 82 and the central tube 86 as the thermal transfer fluid traverses the length of the central tubing to an outlet header 89 leading to an outlet port.

This design also permits insertion of an optional electrical heater cylinder in the central tube 88 and is compatible as well with use of hot gas fed from the compressor as well as thermal expansion valve control or solenoid expansion control of chilled refrigerant from a flow of pressurized liquid.

Again, the helical refrigerant tubing is thermally and mechanically united with the tube surface by brazing, welding or soldering on a contact line extending helically along the length of the mandrel 82.

For efficiency, care is taken that an inserted concentric heater auxiliary to other sources is precision fit into the central tube, and that the inner and outer tubes are precision fit to a high degree of precision on assembly.

Figure 12:
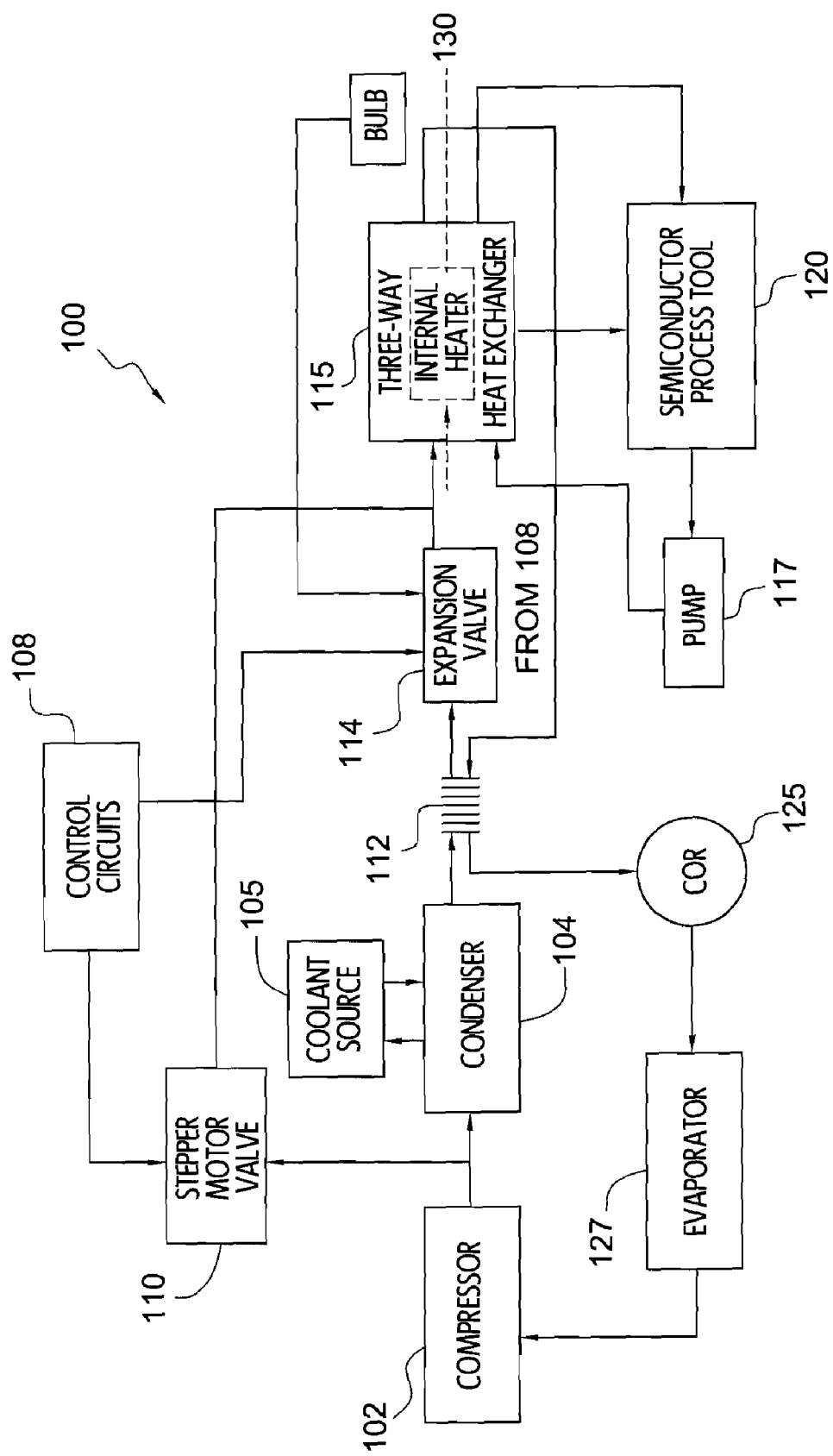
FIG. 12 is a block diagram of a different temperature control unit in accordance with the invention.

A different TCU 100 is shown in FIG. 12. The system 100 functions simply as a conventional vapor-cycle refrigerator when not being called on to heat or control temperature; typically employing a conventional as a refrigerant such as R507. The compressor 102 takes gaseous refrigerant in at low pressure, compresses it and passes it to the condenser 104. In the condenser 104 heat is absorbed by a flow of facility water (or air) from a coolant source 105 so that the high pressure gas coming from the compressor 102 output is liquefied as condenser 104 output. While the unit 100 is being directed only to cool, control circuits 108 fully close a stepper motor valve 110 so that only the conventional refrigeration cycle is used. Liquid refrigerant travels from the condenser 104 to a subcooler heat exchanger 112 wherein the liquid refrigerant exchanges thermal energy with colder gaseous refrigerant flowing in counter-current fashion within the subcooler 112. The liquid refrigerant, after thus being further cooled in the subcooler 112 is passed to an expansion valve 114, either a thermal expansion valve (TVX) or a solenoid expansion valve (SXV). In a TXV, the liquid flashes to a lower temperature mixture of gas and liquid in a conventional and known manner, lowering the temperature to a level set by the control circuits. The refrigerant passes through a three-way heat exchanger 115 in accordance with the invention within which component the refrigerant cools a flow of thermal transfer fluid liquid Galden or deionized water/ethylene glycol (DI/EG) passed through the heat exchanger 115 by a pump 117 which then directs the flow to cool a semiconductor process tool 120. In known fashion, the operation of a TXV-type expansion valve 114 is stabilized by pressure fed back to the valve from a bulb 113 at the refrigerant output of the heat exchanger 115. If a solenoid expansion valve is employed before the HEX 115 it usually is operated in a varying duty cycle.

In the "cooling only" mode, the gas passes back to the compressor 102 in conventional fashion, first through the subcooler 112 then through a crankcase overpressure regulator (or "COR") 125, in which the return stream at the suction input to the compressor 102 is maintained below that pressure which would be harmful at the compressor, input. Liquid remaining in the return stream after the crankcase overpressure regulator 125 is eliminated by an evaporator 127, which is cooled by the utilities water (or air) also supplied to the condenser 104.

When the tool 120 temperature is colder than desired, and heating is required, the control circuit 108 causes the stepper motor valve 110 to open. This introduces a flow of superheated gas directly to the heat exchanger 115. The control circuit 108 operates the stepper motor valve 110 in time modulated mode, to set the average temperature of the semiconductor tool 120.

The system of FIG. 12 takes particular advantage of the capabilities of the three-way heat exchanger 115, being capable of operating in a pure hot gas mode in an intermediate mixed phase mode with both liquid and vapor constituents, and in a cold gas mode with only expanded vapor. None of these modes unduly stress the company and mechanically stable heat exchanger, which can accept the refrigerant in whatever phase it is provided. Moreover the internal heater 130 within the heat exchanger 115 can be activated by the control circuits 108 to heat the thermal transfer fluid independently or in support of the system.

Although a number of forms and variations have been described above and illustrated in the drawings, the invention is not limited thereto but encompasses all forms and variations in accordance with the appended claims.

We claim:

1. A compact heat exchanger for interchanging thermal energy between two different fluids while maintaining the two different fluids physically separate, and also having capability for adding thermal energy, the heat exchanger comprising:

a tubular body comprising two concentric cylindrical heat conductive elements disposed along a longitudinal axis and spaced apart by a selected radial gap, the outer one of the cylindrical elements having an outer diameter of less than 2.00", and the inner one of the cylindrical elements being sized such that the radial gap is less than 0.50";

a hollow, heat conductive tubular member wrapped about the inner one of the cylindrical elements and defining a helical path along the longitudinal axis, said tubular member being disposed in and having a diameter filling the radial gap between the two concentric cylindrical elements, and being in thermally conductive contact with both said concentric cylindrical elements and confining a first of the fluids that is fed into the radial gap between the cylindrical elements to a helical path along the longitudinal axis within the radial gap between the turns of said tubular member, the tubular member receiving and confining the second of the two fluids, such that the two fluids flow in interspersed helical paths separated only by the wall thickness of the tubular member;

first end ports coupled to the opposite longitudinal ends of the radial gap between the cylindrical elements for transporting the first of the fluids along the helical path in the space between the turns of the tubular member;

second end ports coupled to the interior of the hollow tubular member at the opposite longitudinal ends of the hollow, heat conductive tubular member for feeding the second of the fluids therethrough;

wherein the first of the fluids is a thermal transfer fluid and the second of the fluids is an at least partially vaporizable refrigerant, and wherein the exchanger further includes a heater element removably positioned in the interior of the interior cylindrical element in thermal exchange relation with the first fluid flowing in the radial gap between the cylindrical elements, the heater element comprising a cylindrical electrical heater substantially filling the interior of the inner cylindrical element and in thermal interchange relation thereto.

2. The heat exchanger as set forth in claim 1, wherein the tubular body includes thermally conductive joinder material tangentially joining surfaces of the tubular member to the adjacent surfaces of the inner and outer concentric cylindrical elements and wherein the inner cylindrical element has an outer dimension of about 0.750" and the helical path of the tubular element has a pitch of about 0.70"/turn.

3. The heat exchanger as set forth in claim 2, wherein the first of the fluids comprises a thermal transfer fluid the temperature of which is to be principally regulated by the second of the fluids, the second of the fluids comprising a vaporizable refrigerant output from a compression/evaporation cycle, wherein the heat exchanger further includes:

a third cylindrical heat conductive element having an external diameter fitting radially and concentrically within the inner one of the cylindrical elements in the tubular body, to provide a radial flow gap for a third fluid, and radially projecting elements of small surface area integrally formed in at least one of the inner one of the cylindrical elements and the third cylindrical element at spaced apart longitudinal positions along the length of the heat exchanger, said radially projecting elements projecting from one of the cylindrical elements toward the other of the cylindrical elements, defining a radial flow gap for a third fluid, to engage the adjacent cylindrical element and maintain the radial flow gap despite any forces that may tend to distort the shape and diminish said radial flow gap for the third fluid.

4. The heat exchanger as set forth in claim 2, wherein the spacings between the first and second cylindrical elements and the pitch of the tubular member are selected to provide cross-sectional flow areas therebetween for the thermal transfer fluid that are of about of the same magnitude as the internal cross-sectional area of the hollow tubular member for transporting refrigerant.

5. The heat exchanger as set forth in claim 4, wherein the exchanger is about 23 to 25 inches long, and wherein the tubular member is of highly heat conductive metal of selected wall thickness and wherein said wall comprises the sole material intervening between the fluids to provide direct thermal energy transfer through the tubular member wall between the first and second fluids.

* * * * *